United States Patent
Hatsumi et al.

(10) Patent No.: US 12,167,631 B2
(45) Date of Patent: Dec. 10, 2024

(54) DISPLAY DEVICE HAVING LIGHT-RECEIVING REGION BETWEEN FIRST-AND-SECOND-EMITTING REGIONS

(71) Applicant: Semiconductor Energy Laboratory Co., Ltd., Kanagawa-ken (JP)

(72) Inventors: Ryo Hatsumi, Kanagawa (JP); Taisuke Kamada, Saitama (JP); Daisuke Kubota, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 411 days.

(21) Appl. No.: 17/626,212

(22) PCT Filed: Jul. 10, 2020

(86) PCT No.: PCT/IB2020/056499
§ 371 (c)(1),
(2) Date: Jan. 11, 2022

(87) PCT Pub. No.: WO2021/009638
PCT Pub. Date: Jan. 21, 2021

(65) Prior Publication Data
US 2022/0246893 A1    Aug. 4, 2022

(30) Foreign Application Priority Data
Jul. 17, 2019   (JP) .................. 2019-131601

(51) Int. Cl.
*H10K 50/86*    (2023.01)
*H10K 59/13*    (2023.01)
(Continued)

(52) U.S. Cl.
CPC ........... *H10K 50/865* (2023.02); *H10K 59/13* (2023.02); *H10K 59/40* (2023.02)

(58) Field of Classification Search
CPC .. H10K 50/856; H10K 59/8792; H10K 59/13; H10K 59/40; H10K 59/65
See application file for complete search history.

(56) References Cited

U.S. PATENT DOCUMENTS 8,502,756 B2   8/2013   Nakamura et al.
8,502,902 B2   8/2013   Kurokawa et al.
(Continued)

FOREIGN PATENT DOCUMENTS

CN   102054400 A   5/2011
CN   103988119 A   8/2014
(Continued)

OTHER PUBLICATIONS

International Search Report (Application No. PCT/IB2020/056499) Dated Sep. 8, 2020.
(Continued)

*Primary Examiner* — Michael Jung
(74) *Attorney, Agent, or Firm* — Husch Blackwell LLP

(57) ABSTRACT

An object is to provide a display device having a function of emitting visible light and infrared light and an imaging function. Another object is to increase the definition without changing the density of imaging elements while the high resolution of an image displayed on a display device is kept. The display device has a layout in which a light-receiving region of an imaging element is provided between light-emitting regions of a plurality of light-emitting elements over one substrate. In the imaging function of the display device, as a means for increasing the definition of a captured image, the definition is increased without changing the density of imaging elements by capturing an image by time division.

8 Claims, 13 Drawing Sheets

(51) Int. Cl.
*H10K 59/40* (2023.01)
*H10K 59/65* (2023.01)
*H10K 59/80* (2023.01)

(56) References Cited

U.S. PATENT DOCUMENTS

| | | | |
|---|---|---|---|
| 8,847,245 | B2 | 9/2014 | Kurokawa |
| 8,847,860 | B2 | 9/2014 | Nakamura et al. |
| 9,547,191 | B2 | 1/2017 | Hibayashi et al. |
| 9,817,520 | B2 | 11/2017 | Ikeda et al. |
| 10,031,622 | B2 | 7/2018 | Kurokawa et al. |
| 10,910,574 | B2 | 2/2021 | Li et al. |
| 2011/0102308 | A1 | 5/2011 | Nakamura et al. |
| 2011/0221945 | A1 | 9/2011 | Kurokawa et al. |
| 2014/0267955 | A1 | 9/2014 | Hibayashi et al. |
| 2016/0266695 | A1 | 9/2016 | Bae et al. |
| 2018/0062098 | A1 | 3/2018 | Li et al. |
| 2018/0069068 | A1* | 3/2018 | Ka ........................ H10K 59/1213 |
| 2020/0133414 | A1* | 4/2020 | Lee .......................... G06F 3/044 |
| 2020/0184178 | A1* | 6/2020 | Zhou ..................... H10K 59/65 |
| 2020/0293739 | A1* | 9/2020 | Yang ................... H10K 59/126 |
| 2021/0296409 | A1 | 9/2021 | Yamazaki et al. |
| 2021/0351224 | A1 | 11/2021 | Yamazaki et al. |
| 2021/0377463 | A1 | 12/2021 | Ikeda et al. |

FOREIGN PATENT DOCUMENTS

| | | |
|---|---|---|
| CN | 109477988 A | 3/2019 |
| EP | 2 330 819 A2 | 6/2011 |
| EP | 2 790 053 A1 | 10/2014 |
| EP | 3 288 083 A2 | 2/2018 |
| JP | 2011-118330 A | 6/2011 |
| JP | 2013-140323 A | 7/2013 |
| JP | 2015-005280 A | 1/2015 |
| JP | 2016-208527 A | 12/2016 |
| JP | 2019-501399 | 1/2019 |
| KR | 2007-0117968 A | 12/2007 |
| KR | 2013-0028076 A | 3/2013 |
| KR | 2014-0097559 A | 8/2014 |
| KR | 2018-0122719 A | 11/2018 |
| WO | WO 2011/111530 A1 | 9/2011 |
| WO | WO 2013/084577 A1 | 6/2013 |
| WO | WO 2016/144108 A1 | 9/2016 |
| WO | WO 2018/035812 A1 | 3/2018 |
| WO | WO 2018/211355 A1 | 11/2018 |

OTHER PUBLICATIONS

Written Opinion (Application No. PCT/IB2020/056499) Dated Sep. 8, 2020.

* cited by examiner

→ emitted light
⇢ reflected light

FIG. 3A
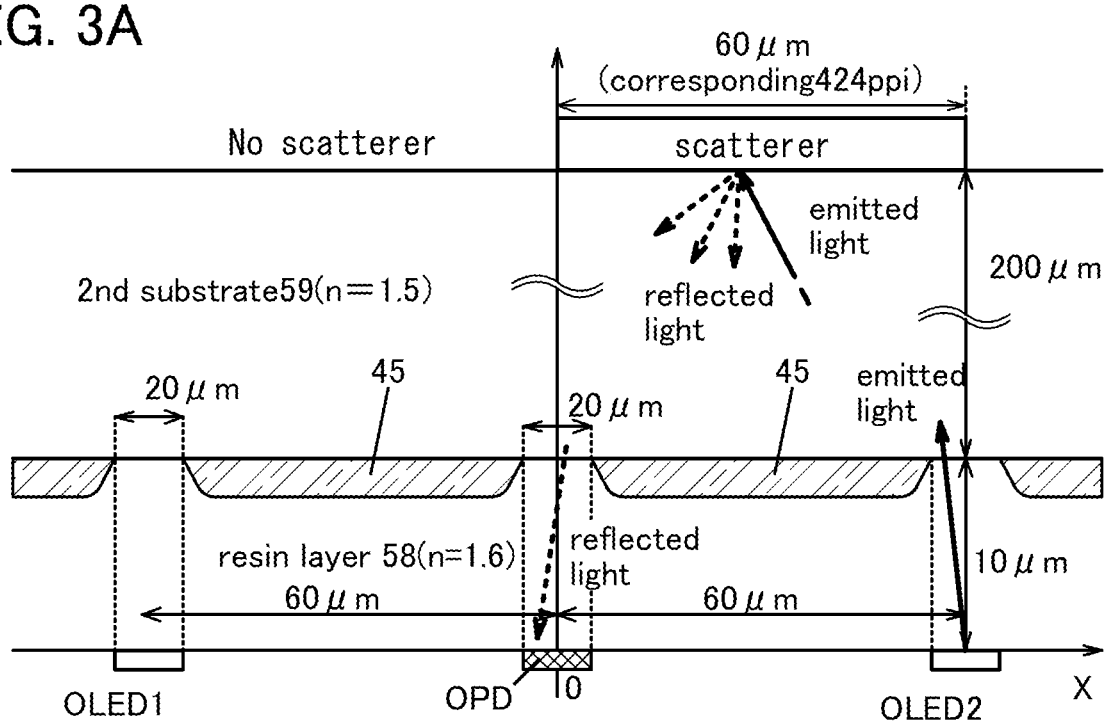
FIG. 3B Model 1
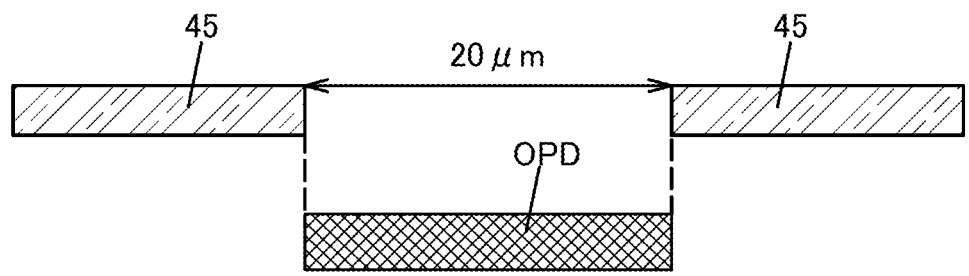
FIG. 3C Model 2
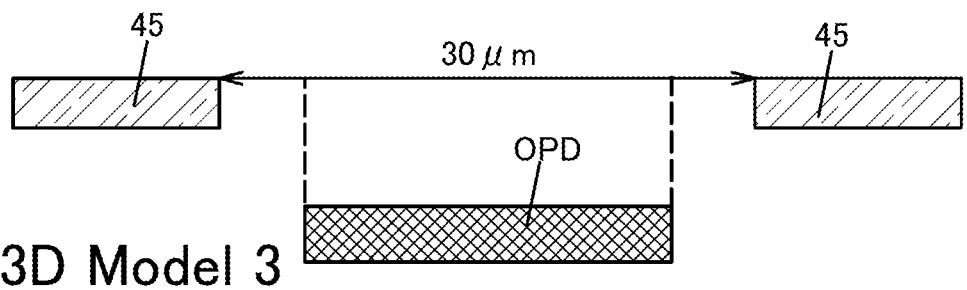
FIG. 3D Model 3
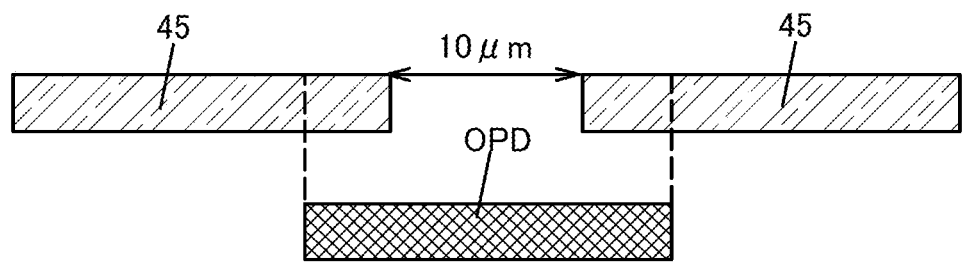

FIG. 4A Model 4
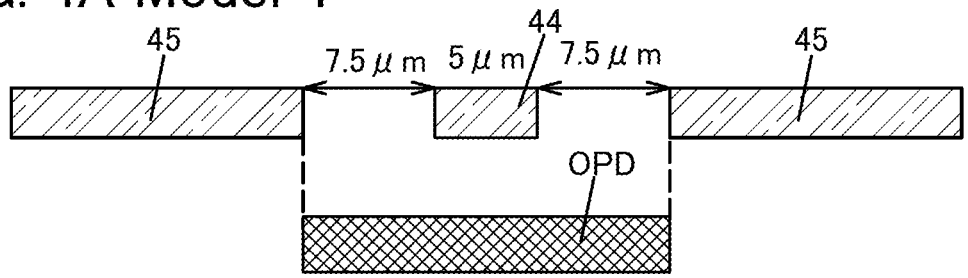
FIG. 4B Model 5
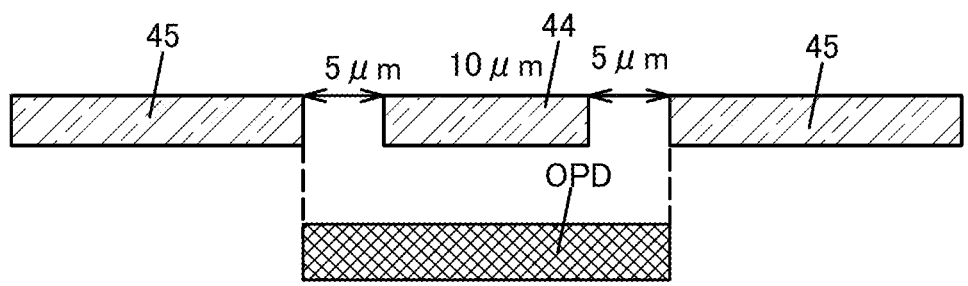
FIG. 4C Model 6
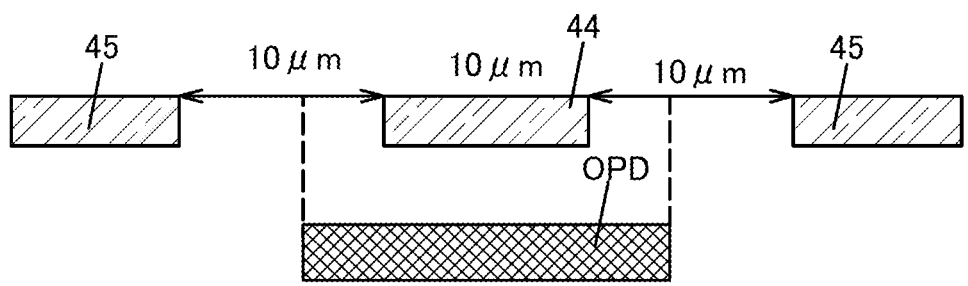

DISPLAY DEVICE HAVING LIGHT-RECEIVING REGION BETWEEN FIRST-AND-SECOND-EMITTING REGIONS

This application is a 371 of international application PCT/IB2020/056499 filed on Jul. 10, 2020 which is incorporated herein by reference.

TECHNICAL FIELD

One embodiment of the present invention relates to a display device. Another embodiment of the present invention relates to an imaging device.

Note that one embodiment of the present invention is not limited to the above technical field. One embodiment of the invention disclosed in this specification and the like relates to an object, a method, and a manufacturing method. One embodiment of the present invention relates to a process, a machine, manufacture, or a composition of matter. Therefore, specific examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof.

Note that in this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. An imaging device, a display device, a liquid crystal display device, a light-emitting device, an input device, an input/output device, an electro-optical device, a power generation device (including a thin film solar cell, an organic thin film solar cell, and the like), and an electronic device may each include a semiconductor device.

BACKGROUND ART

An imaging panel including a plurality of imaging pixels on an insulating surface of a substrate is known (Patent Document 1). The imaging pixel includes a plurality of windows which are arranged in a matrix and transmit visible light, a photoelectric conversion element having a grid-like formation which extends between the plurality of windows and supplies a signal, and a sensor circuit supplied with the signal.

REFERENCE

Patent Document

[Patent Document 1] Japanese Published Patent Application No. 2015-005280

SUMMARY OF THE INVENTION

Problems to be Solved by the Invention

An object of one embodiment of the present invention is to provide a display device having a function of emitting visible light and infrared light. An object of one embodiment of the present invention is to provide a highly convenient display device. An object of one embodiment of the present invention is to provide a multifunctional display device. An object of one embodiment of the present invention is to provide a novel display device.

An object of one embodiment of the present invention is to provide a display device having a function of emitting visible light and infrared light and an imaging function.

The definition of the imaging function depends mainly on the density of imaging elements that are used. A large number of imaging elements per unit area might decrease the resolution of the display device and might complicate a process.

In the case of a full-color display device, at least three kinds of light-emitting elements of R, G, and B are arranged. A display area of the display device is limited; a light-emitting region of a light-emitting element and a light-receiving region of an imaging element are arranged in a pixel. Therefore, an increase in the number of imaging elements is limited by the occupation area, the process accuracy, and the like.

Thus, an object is to increase the definition of a display without changing the density of imaging elements while the high resolution of an image displayed on the display device is kept.

Another object is to provide a novel device including a display device including a means capable of accurately capturing a high-resolution image of a finger print or the like touching a display surface.

Another object is to provide a structure that prevents an increase in manufacturing cost of a display device even with a light-receiving region in a display surface.

Means for Solving the Problems

A display device has a layout in which a light-receiving region of an imaging element is provided between light-emitting regions of a plurality of light-emitting elements over the same substrate. In an imaging function of the display device, as a means for increasing the definition of a captured image, the definition is increased by capturing an image by time division without changing the density of imaging elements.

Capturing an image by time division refers to capturing a plurality of images consecutively in a predetermined light exposure time. By capturing images consecutively by time division, a plurality of images read by intermittent light exposure can be combined. In this specification, first light exposure (light exposure in a first time division light exposure time) from a light-emitting region positioned adjacent to one side of an imaging element and second light exposure (light exposure in a second time division light exposure time) from a light-emitting region positioned adjacent to the other side are successively performed in order.

A structure of the invention disclosed in this specification is a display device that includes a light-transmitting substrate; a substrate that is fixed to face the substrate and includes an insulating surface; a plurality of light-receiving regions and a plurality of light-emitting regions over the substrate that includes the insulating surface; and, on the light-transmitting substrate, a first light-blocking layer that includes an opening portion and a second light-blocking layer that has a distance to the first light-blocking layer. The opening portion of the first light-blocking layer is positioned to overlap with one of the plurality of light-receiving regions. The second light-blocking layer is positioned to overlap with part of the one of the light-receiving regions.

In the above structure, each of the plurality of light-emitting regions is a green-light-emitting region, a bluelight-emitting region, a red-light-emitting region, or an infrared light-emitting region.

Another structure of the invention is a display device that includes a light-transmitting substrate; a substrate that is fixed to face the substrate and includes an insulating surface; two light-emitting regions and one light-receiving region between the two light-emitting regions over the substrate that includes the insulating surface; and, on the light-transmitting substrate, a first light-blocking layer that includes an opening portion and a second light-blocking layer that has a distance to the first light-blocking layer. The opening portion of the first light-blocking layer is positioned to overlap with the light-emitting region or the light-receiving region. The second light-blocking layer is positioned to overlap with part of the one light-receiving region.

In the above structure, a single-color light-emitting region such as a green-light-emitting region is preferably used as the light-emitting region.

In each of the above structures, the number of the light-emitting regions included in the display device can be larger than the number of the light-receiving regions. The definition can be increased without changing the density of the imaging elements while the resolution of image display can be kept high.

In each of the above structures, the width of the second light-blocking layer is greater than or equal to 5 μm and less than or equal to 10 μm. When the width is in the above range, a sufficient S/N ratio can be obtained even when an image is captured by time division.

In each of the above structures, the first light-blocking layer and the second light-blocking layer are formed using the same material. When the first light-blocking layer and the second light-blocking layer can be formed using the same material in the same step, the light-receiving element can be incorporated into the display device without a significant increase in the number of manufacturing steps.

In each of the above structures, a light-transmitting organic resin is provided between the light-transmitting substrate and the substrate that includes the insulating surface.

In each of the above structures, the light-emitting region includes a pixel electrode and an organic compound layer overlapping with the pixel electrode.

In each of the above structures, the light-receiving region includes the same material as the organic compound layer overlapping with the pixel electrode. When the organic compound layer overlapping with the pixel electrode can be formed using the same material in the same step, the light-receiving element can be incorporated into the display device without a significant increase in the number of manufacturing steps.

Effect of the Invention

One embodiment of the present invention can provide a multifunctional display device. One embodiment of the present invention can provide a novel display device. One embodiment of the present invention can provide a display device having a function of emitting visible light and infrared light and an imaging function.

According to one embodiment of the present invention, the definition can be increased without an increase in the density of imaging elements.

BRIEF DESCRIPTION OF THE DRAWINGS

FIG. 3A illustrates a structure showing set conditions for calculation, and FIG. 3B, FIG. 3C, and FIG. 3D illustrate comparative examples of arrangement models.

FIG. 4A, FIG. 4B, and FIG. 4C illustrate arrangement models of this embodiment.

MODE FOR CARRYING OUT THE INVENTION

Embodiments of the present invention are described in detail below with reference to the drawings. Note that the present invention is not limited to the following description, and it is readily understood by those skilled in the art that modes and details of the present invention can be modified in various ways. In addition, the present invention should not be construed as being limited to the description of the embodiments below.

Embodiment 1

Figure 1A:
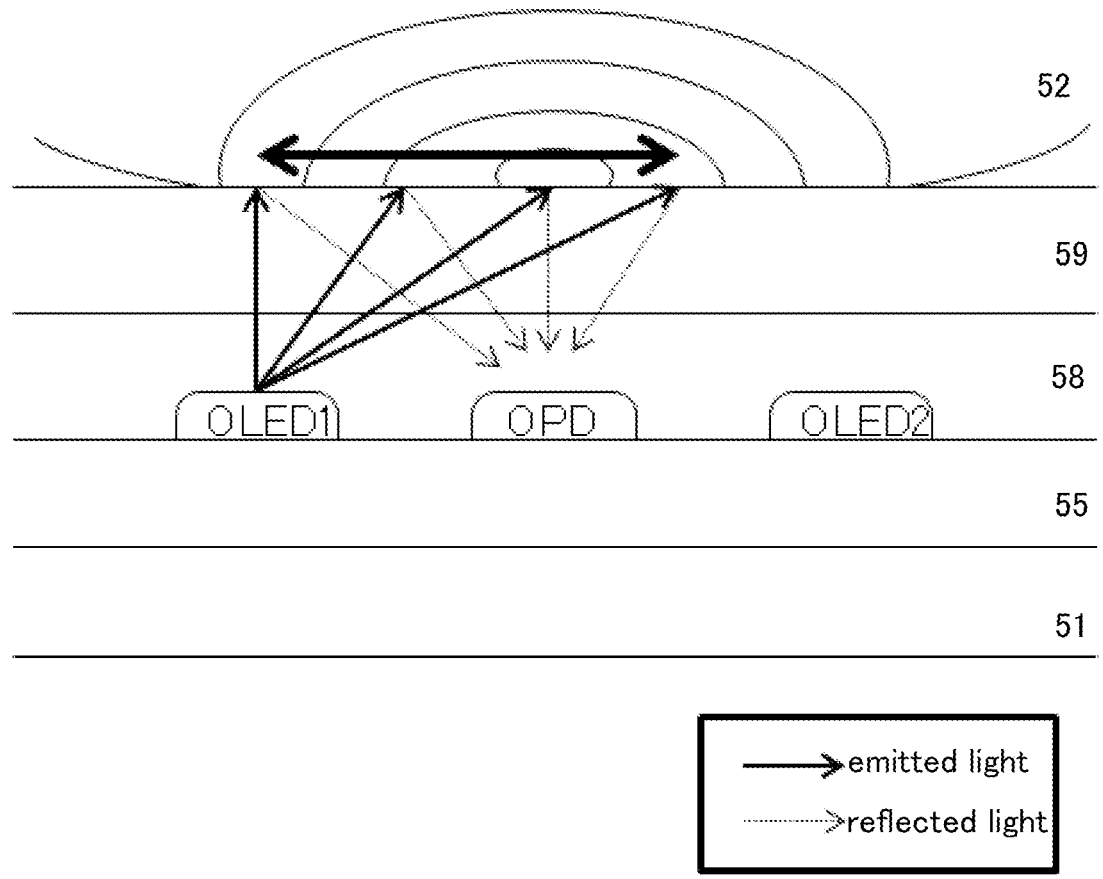
FIG. 1A and FIG. 1B are schematic cross-sectional views illustrating one embodiment of the present invention.
Figure 1B:
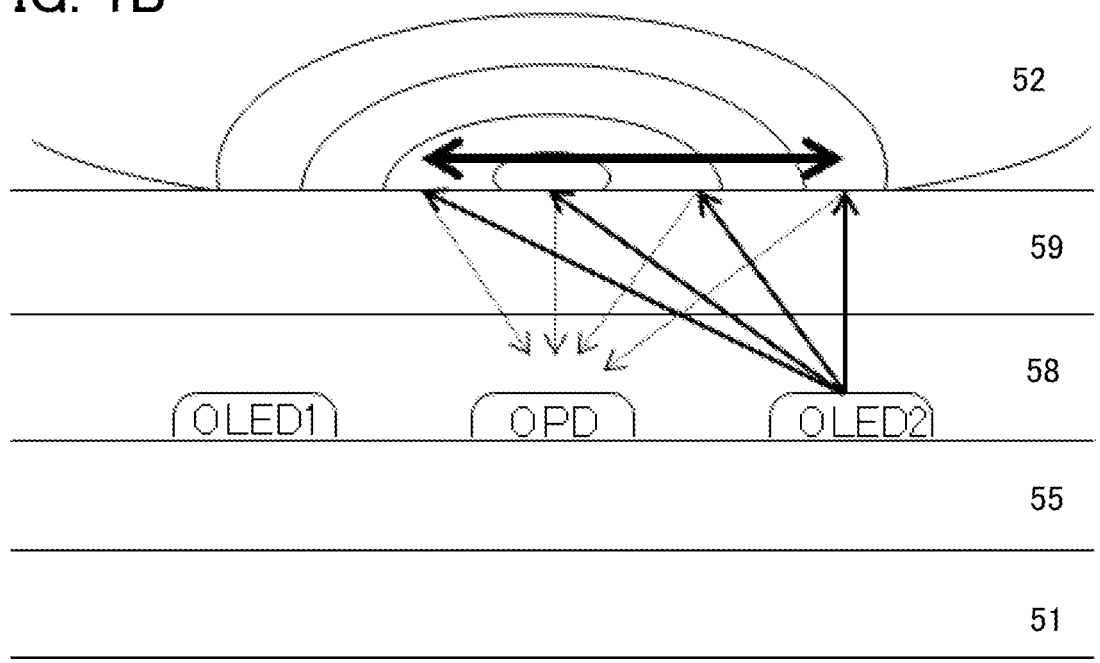

FIG. 1A and FIG. 1B are schematic cross-sectional views of a display device of one embodiment of the present invention.

In each of FIG. 1A and FIG. 1B, a first substrate 51, a second substrate 59, a resin layer 58, a first light-emitting element OLED1, a second light-emitting element OLED2, an imaging element OPD, and an element layer 55 are shown.

The element layer is provided over the first substrate 51. The element layer 55 includes a transistor, a capacitor, and the like.

A material having a property of transmitting visible light or infrared light is used for each of the resin layer 58 and the second substrate 59. As the second substrate 59, a glass substrate may be used, or a plastic substrate that is formed as a film, for example, a plastic substrate made from polyimide (PI), aramid, polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), a silicone resin, or the like can be used.

FIG. 1A and FIG. 1B show capturing an image of a finger print by time division. In the case where first light exposure and second light exposure are performed sequentially, FIG. 1A is a schematic view showing the state of the first light exposure, and FIG. 1B is a schematic view showing the state of the second light exposure.

In FIG. 1A, the imaging element OPD senses light emitted from the first light-emitting element OLED1 and reflected by the finger. A region mainly captured is in a range that is indicated by a double-headed arrow illustrated in a position overlapping with a subject 52 such as a finger in FIG. 1A.

In FIG. 1B, the imaging element OPD senses light emitted from the second light-emitting element OLED2 and reflected by the finger. A region mainly captured is in a range that is indicated by a double-headed arrow illustrated in a position overlapping with the subject 52 such as a finger.

Figure 2A:
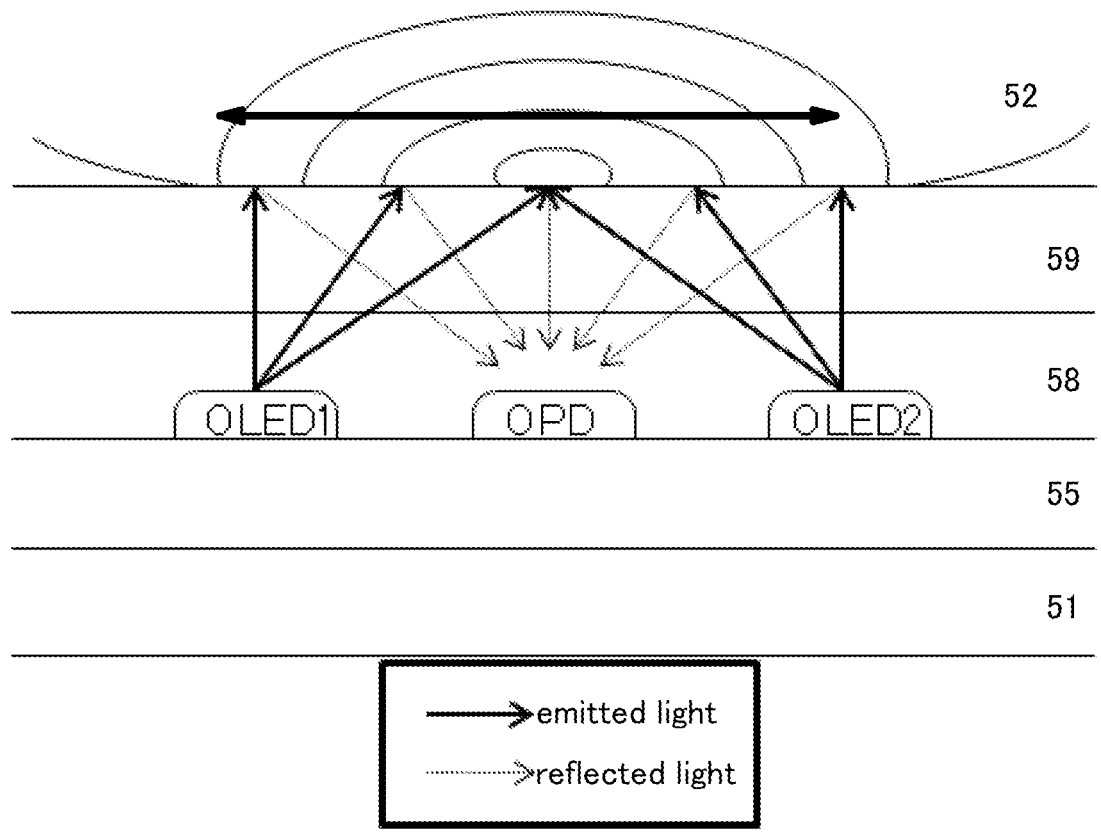
FIG. 2A illustrates an example in which two types of light emission are performed at the same time.

In the case where the first light-emitting element OLED1 and the second light-emitting element OLED2 emit light almost at the same time, the imaging element OPD senses reflected light from a wide range directly over the imaging element OPD (a range indicated by a double-headed arrow illustrated in a position overlapping with the subject 52 such as a finger) as illustrated in FIG. 2A.

Figure 2B:
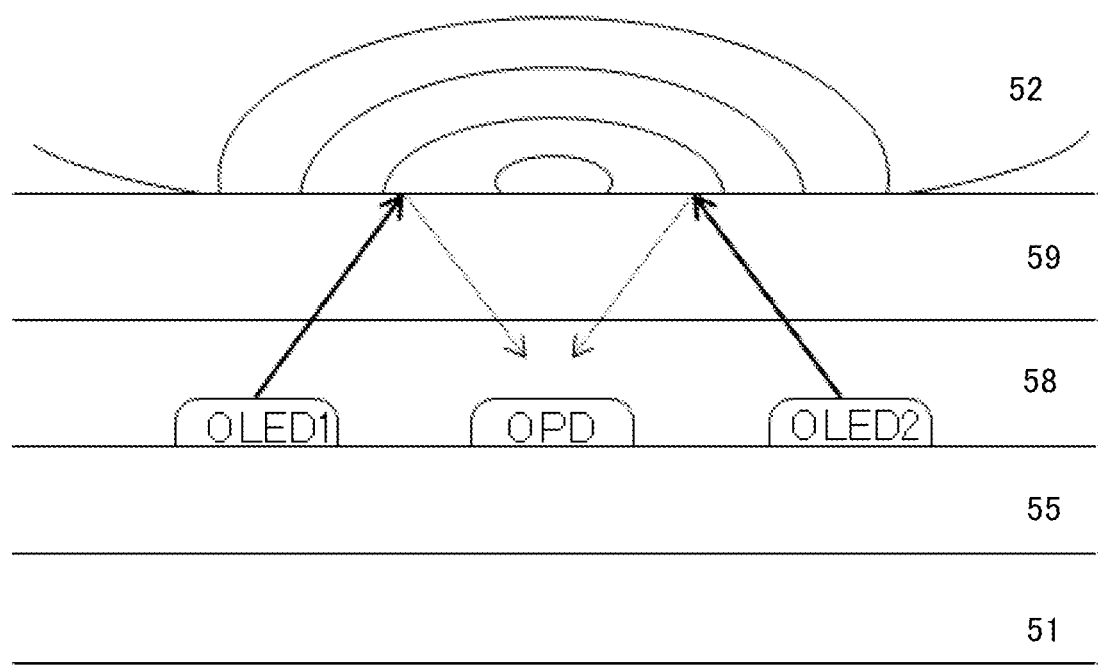
FIG. 2B is a schematic cross-sectional view illustrating one embodiment of the present invention.

Meanwhile, when the main component of the sensed reflected light is a regular reflection component, light emitted from the first light-emitting element OLED1 and light emitted from the second light-emitting element OLED2 are sensed at different positions as in FIG. 2B. Light reflection can fall mainly into regular reflection and diffuse reflection, and a regular reflection component is a component in which the incident angle and the reflex angle are equal and reflected light rays are parallel light rays. In the case of FIG. 2B, when the first light-emitting element OLED1 and the second light-emitting element OLED2 emit light at different timings (with time divided) and reflected light rays thereof are sensed, one imaging element OPD can sense reflection data of a plurality of positions. Thus, it can be said that the resolution of a captured image can be increased without an increase in the number of the imaging elements OPD.

In the following, an optical simulation (ray tracing) is performed to examine an optical system.

FIG. 3A is a cross-sectional view of an optical system in the optical simulation.

The optical simulation is conducted on the assumption that the pixel density of a display panel is 212 ppi (a pixel size of 120 μm squared). With the imaging element OPD positioned in the center (X=0), the first light-emitting element OLED1 and the second light-emitting element OLED2 are arranged on the opposite sides at an interval of 60 μm. The structure (stacked-layer structure) in the vertical axis direction is set by the film thickness and the optical constant assuming the display panel (detailed conditions are also shown in FIG. 3A). The resin layer 58 has a thickness of 10 μm and a refractive index n of 1.6. The substrate (the second substrate 59) has a thickness of 200 μm and a refractive index n of 1.5. The width of an opening portion in a light-blocking layer 45 is 20 μm. The width of the imaging element OPD, i.e., the width of a light-receiving region is also 20 μm. The width of a light-emitting region of the first light-emitting element OLED1 is also 20 μm. The width of a scatterer is 60 μm (corresponding to 424 ppi).

FIG. 3B shows an arrangement model 1 of the light-blocking layer, which is a comparative example. Note that the arrangement model 1 of the light-blocking layer corresponds to FIG. 3A.

FIG. 3C shows an arrangement model 2 of the light-blocking layer, which is another comparative example. In the arrangement model 2, the width of the opening portion in the light-blocking layer is 30 μm.

FIG. 3D shows an arrangement model 3 of the light-blocking layer, which is another comparative example. In the arrangement model 3, the width of the opening portion in the light-blocking layer is 10 μm.

In the above simulation, the scatterer (subject) of perfect scattering is arranged over the second substrate 59, and a change in the amount of light sensed by the imaging element OPD is simulated while the position of the scatterer is shifted in the X axis direction. In this way, it can be confirmed at which position the scatterer receives the strongest reflected light, i.e., from which position of the reflected light is received the strongest. It is confirmed how this feature is affected by the light emission states of the first light-emitting element OLED1 and the second light-emitting element OLED2.

Figure 5:
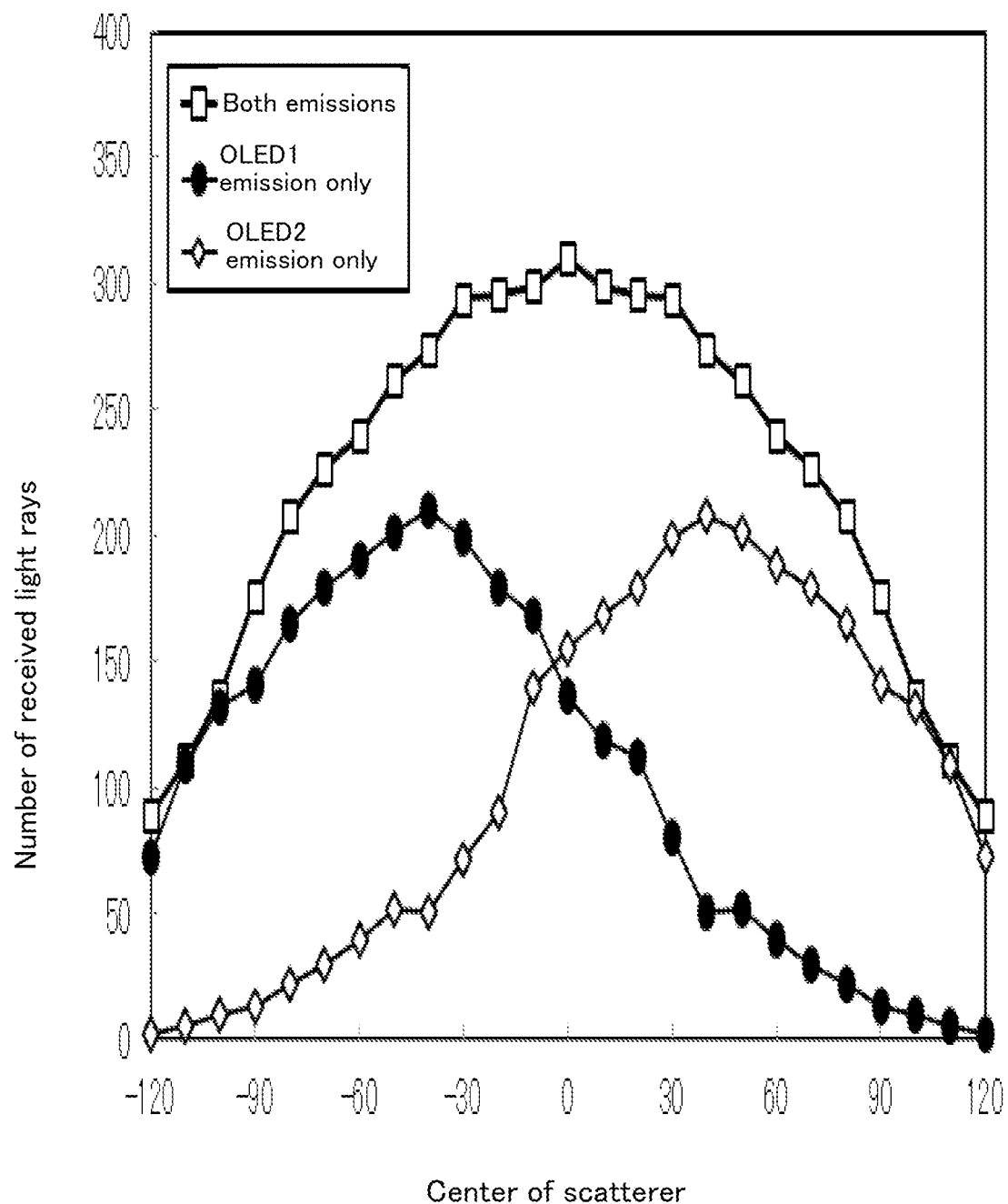
FIG. 5 shows calculation results of the arrangement model 1.

FIG. 5 shows a result of the comparative example (arrangement model 1).

In the case where both of the light-emitting elements emit light as in FIG. 2B, it can be confirmed that the number of received light rays is the largest when the scatterer is positioned with the center at a position X=0 (when the scatterer is directly over OPD). In contrast, in the case where either the first light-emitting element OLED1 or the second light-emitting element OLED2 emits light, it is confirmed that the position of the center of the scatterer at which the number of received light rays is the largest is shifted from X=0 by approximately 40 μm, or approximately 50 μm at a maximum to the first light-emitting element OLED1 side or the second light-emitting element OLED2 side.

Thus, when an image is captured while the first light-emitting element OLED1 and the second light-emitting element OLED2 alternately emit light, components of light reflected mainly at different positions can be sensed, whereby an increase in the resolution of a captured image based on the principle shown in FIG. 2B is possible. However, even when only the first light-emitting element OLED1 emits light with the center of the scatterer at around 60 μm, the component of reflected light is sensed on the OLED2 side (a region where the center of the scatterer is positioned at larger than 0) in FIG. 5. Note that even when only the second light-emitting element OLED2 emits light with the center of the scatterer at around −30 μm, the component of reflected light is sensed on the OLED1 side (a region where the center of the scatterer is positioned at smaller than 0) in FIG. 5. Thus, the comparative example (arrangement model 1) cannot be said to have a sufficient S/N ratio.

The S/N ratio indicates the ratio of the white level to the black level in all signals of light received by the imaging element OPD. The white level indicates a state where a certain amount of light is emitted, and the black level indicates a state where light is blocked: both levels are measured as an average value.

The two comparative examples (arrangement models 2 and 3) show the results of low S/N ratios.

Thus, in order to improve the S/N ratio, an island-shaped light-blocking layer (a second light-blocking layer 44) is provided at a position overlapping with part of the light-receiving region of one imaging element OPD. Note that the island-shaped light-blocking layer (the second light-blocking layer 44) is arranged apart from and in no contact with the other light-blocking layer (the first light-blocking layer

45). The first light-blocking layers 45 may be connected in a grid-like manner in a plane.

FIG. 4A illustrates an arrangement model 4 in which the width of the second light-blocking layer 44 is 5 μm. In actual processing, the minimum width of the processing accuracy of the light-blocking layer is approximately 5 μm, and thus it is difficult to form the light-blocking layer (the second light-blocking layer 44) with a width smaller than 5 μm. The width of the opening portion in the first light-blocking layer 45 is 20 μm.

FIG. 4B illustrates an arrangement model 5 in which the width of the second light-blocking layer 44 is 10 μm. The width of the opening portion in the first light-blocking layer 45 is 20 μm, which is the same as the arrangement model 1.

FIG. 4C illustrates an arrangement model 6 in which the width of the second light-blocking layer 44 is 10 μm. The width of the opening portion in the first light-blocking layer 45 is 30 μm.

Figure 6:
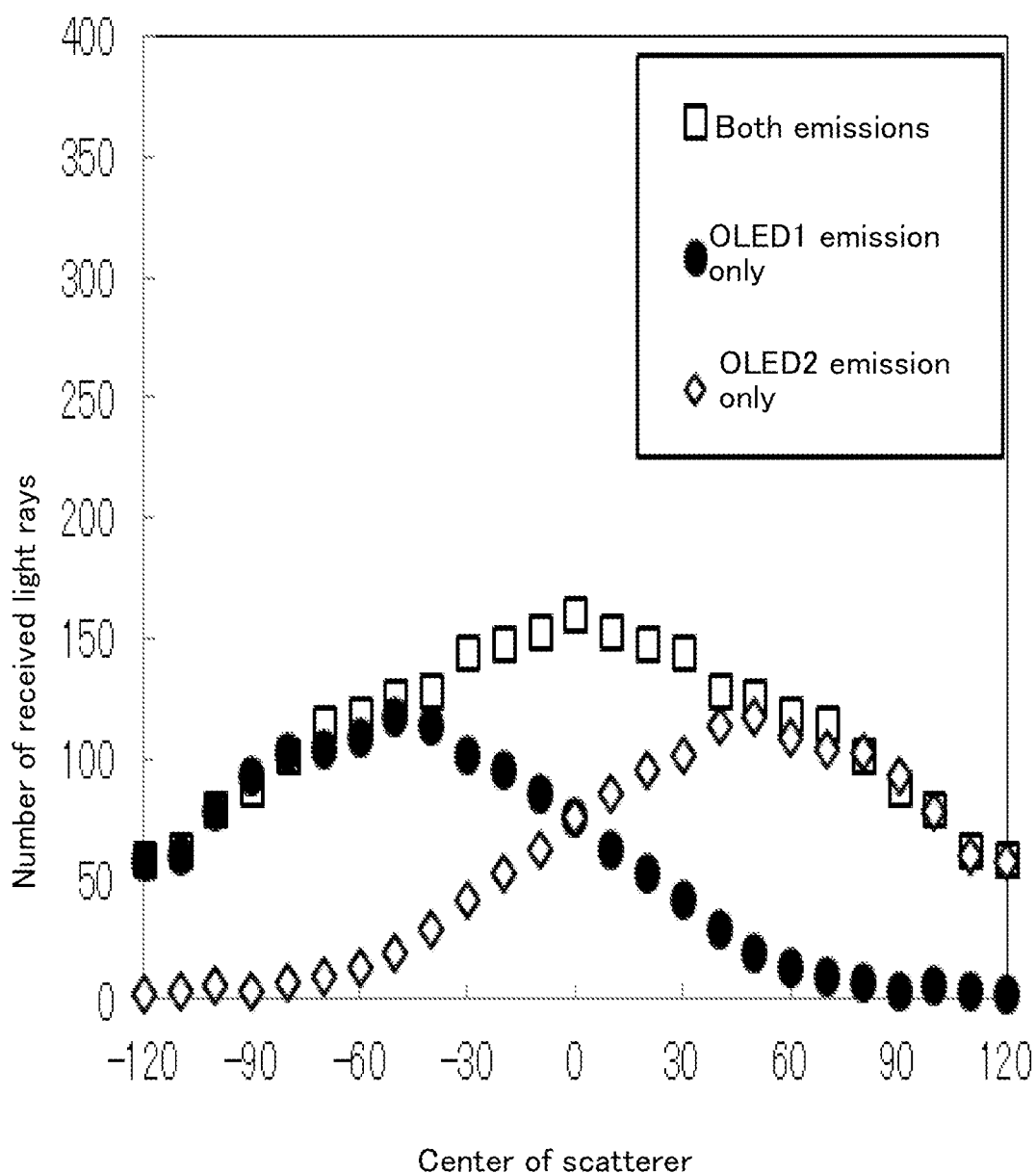
FIG. 6 shows calculation results of the arrangement model 6.

FIG. 6 shows calculation results of the model 6 of FIG. 4C. The S/N ratio is improved as compared to FIG. 5. Even when only OLED1 emits light with the center of the scatterer at around 60 μm, a component of reflected light is hardly sensed in the OLED2 side (a region where the center of the scatterer is positioned at greater than 0) in FIG. 6.

Figure 7:
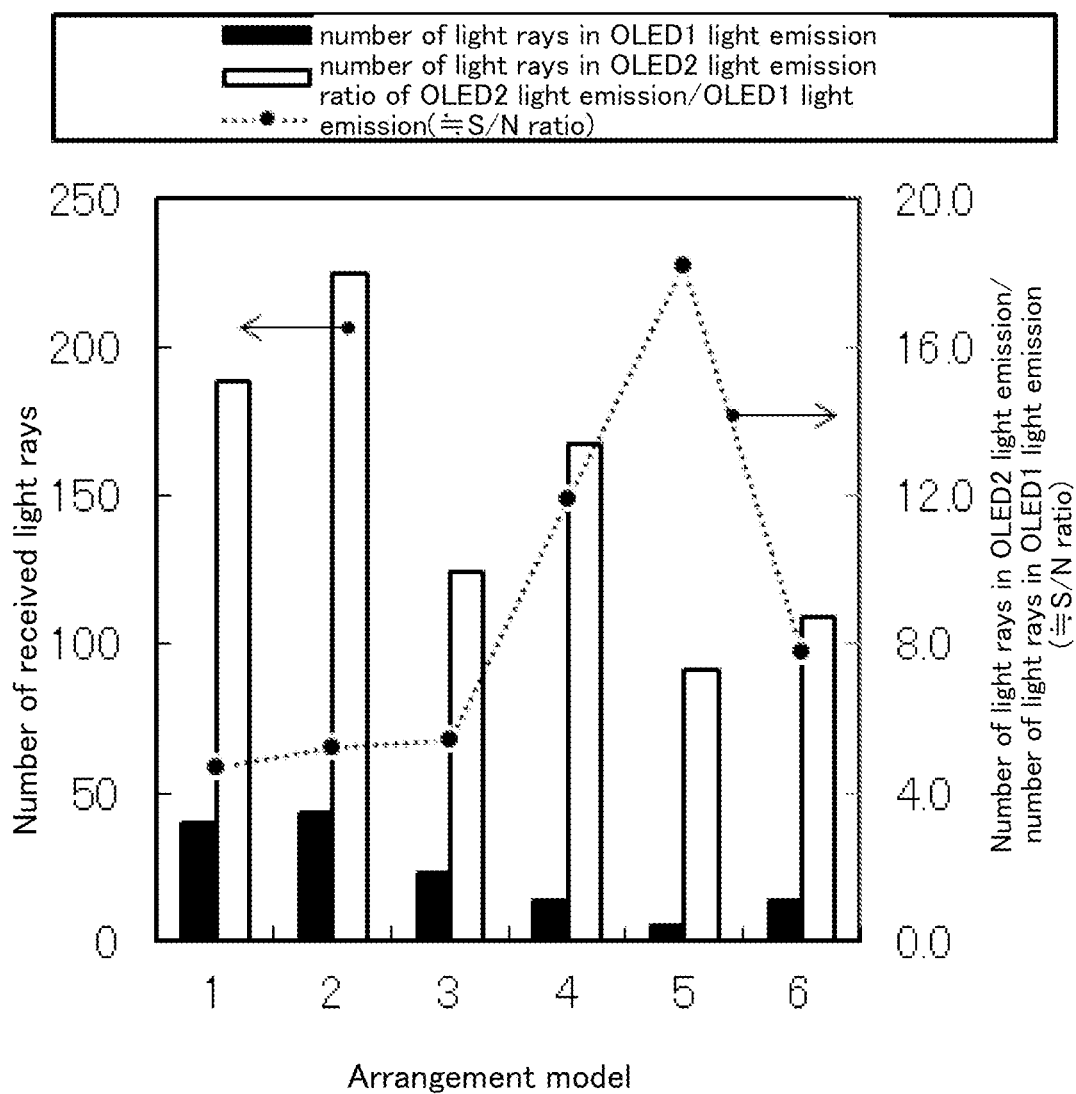
FIG. 7 is a graph collectively showing calculation results of the arrangement models 1, 2, 3, 4, 5, and 6.

FIG. 7 collectively shows calculation results of the arrangement models 1, 2, 3, 4, 5, and 6.

Under the condition where OLED1 emits light, the scatterer is not positioned directly over OLED1 as illustrated in FIG. 3A; the results are shown as black columns (=the number of received light rays is small) in FIG. 7. Under the condition where OLED2 emits light, the scatterer is provided directly over OLED2; the results are shown as white columns (=the number of received light rays is large) in FIG. 7. Accordingly, the number of light rays in OLED2 light emission/the number of light rays in OLED1 light emission corresponds to the S/N ratio in the vicinity of the boundary of the scatterer.

In the case of the arrangement models 1, 2, and 3, which are different only in the size of the opening portion in the light-blocking layer, although the number of received light rays increases or decreases in accordance with the size of the opening portion, it can be confirmed that the S/N ratio itself tends not to change. In contrast, it is confirmed that the S/N ratio is improved in the arrangement models 4, 5, and 6 in which the second light-blocking layer 44 is positioned over OPD.

Figure 8:
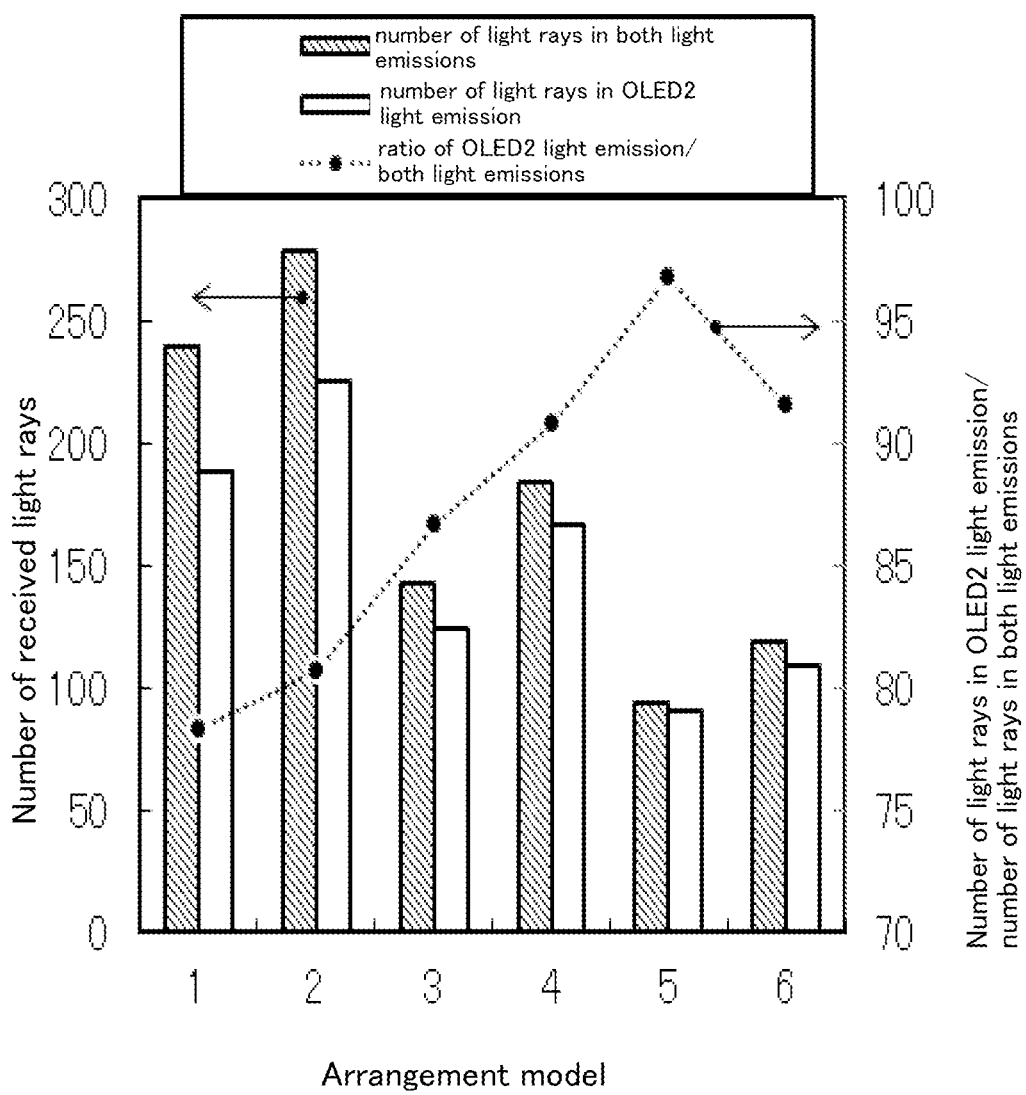
FIG. 8 is a graph showing results of comparing the number of rays of received light of the arrangement models 1, 2, 3, 4, 5, and 6.

Here, FIG. 8 shows comparison results of the number of received light rays when OLED2 emits light and the number of received light rays when both OLED1 and OLED2 emit light at the same time.

From the results in FIG. 8, it is confirmed that the arrangement models 4, 5, and 6, in which the second light-blocking layer 44 is positioned directly over OPD, have tendency to have little difference between the number of received light rays when only OLED2 emits light and that when both OLED1 and OLED2 emit light. These results indicate that a region that delivers reflected light to OPD even when either of two OLEDs emits light, that is, a region that causes a decrease in the S/N ratio is positioned in the vicinity of a region directly over OPD, i.e., in the vicinity of a region directly over the light exposure region. It is important to block light from the vicinity of the region directly over OPD with the second light-blocking layer 44 when an imaging range is divided into two by time division, and the S/N ratios of the arrangement models 4, 5, and 6 are improved in FIG. 7.

Embodiment 2

In this embodiment, top and cross-sectional structures of OPD described in Embodiment 1 are described below.

A display device described below as an example is a device having a function of displaying an image and a function of capturing an image of a subject overlapping with a screen.

The display device of this embodiment includes light-receiving elements and light-emitting elements in its display portion. Specifically, the light-emitting elements are arranged in a matrix in the display portion, and an image can be displayed on the display portion.

Moreover, the light-receiving elements are arranged in a matrix in the display portion, so that the display portion also has a function of a light-receiving portion. The light-receiving portion can be used as an image sensor or a touch sensor. That is, by sensing light with the light-receiving portion, image data can be obtained, i.e., imaging can be performed, and the approach or touch of an object (e.g., a finger or a stylus) can be detected.

In the display device of this embodiment, when an object reflects light emitted from the light-emitting element included in the display portion, the light-receiving element can sense the reflected light; thus, imaging and touch (including near touch) detection are possible even in a dark place.

The display device of this embodiment has a function of displaying an image with use of a light-emitting element. That is, the light-emitting element functions as a display element.

As the light-emitting element, an EL element such as an OLED (Organic Light Emitting Diode) or a QLED (Quantum-dot Light Emitting Diode) is preferably used. As a light-emitting substance included in the EL element, a substance which exhibits fluorescence (a fluorescent material), a substance which exhibits phosphorescence (a phosphorescent material), an inorganic compound (e.g., a quantum dot material), a substance which exhibits thermally activated delayed fluorescence (a thermally activated delayed fluorescent (TADF) material), and the like can be given. Alternatively, an LED (a Light Emitting Diode) such as a micro-LED can also be used as the light-emitting element.

The display device of this embodiment has a function of sensing light with use of a light-receiving element.

When the light-receiving element is used as an image sensor, the display device of this embodiment can capture an image using the light-receiving element.

For example, data on a fingerprint, a palm print, an iris, or the like can be obtained with use of the image sensor. That is, a biological authentication sensor can be incorporated into the display device of this embodiment. When the display device incorporates a biological authentication sensor, the number of components of an electronic device can be reduced as compared to the case where a biological authentication sensor is provided separately from the display device; thus, the size and weight of the electronic device can be reduced.

In addition, data on facial expression, eye movement, change of the pupil diameter, or the like of the user can be obtained with use of the image sensor. By analysis of the data, information on the user's physical and mental state can be obtained. Changing the output contents of one or both of display and sound on the basis of the information allows the user to safely use a device for VR (Virtual Reality), a device for AR (Augmented Reality), or a device for MR (Mixed Reality), for example.

When the light-receiving element is used as the touch sensor, the display device of this embodiment can detect the approach or touch of an object with use of the light-receiving element.

As the light-receiving element, a pn photodiode or a pin photodiode can be used, for example. The light-receiving element functions as a photoelectric conversion element that senses light incident on the light-receiving element and generates charge. The amount of generated charge depends on the amount of incident light.

It is particularly preferable to use an organic photodiode including a layer containing an organic compound as the light-receiving element. An organic photodiode, which is easily made thin, lightweight, and large in area and has a high degree of freedom for shape and design, can be used in a variety of display devices.

In one embodiment of the present invention, organic EL elements are used as the light-emitting elements, and organic photodiodes are used as the light-receiving elements. A large number of layers of the organic photodiode can be shared with the organic EL element. Accordingly, the light-receiving element can be incorporated into the display device without a significant increase in the number of manufacturing steps. For example, an active layer of the light-receiving element and a light-emitting layer of the light-emitting element are separately formed, and the other layers can be shared by the light-emitting element and the light-receiving element.

FIG. 9A, FIG. 9B, FIG. 9C, and FIG. 9D are schematic cross-sectional views each illustrating part of the display device of one embodiment of the present invention.

Figure 9A:
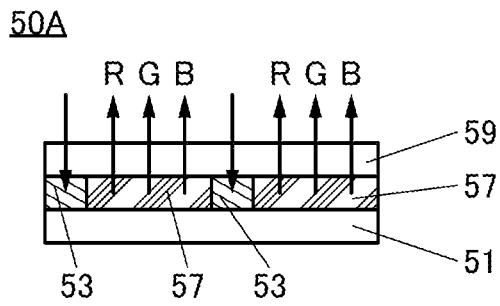
FIG. 9A, FIG. 9B, FIG. 9C, and FIG. 9D are cross-sectional views illustrating examples of display devices.
Figure 9B:
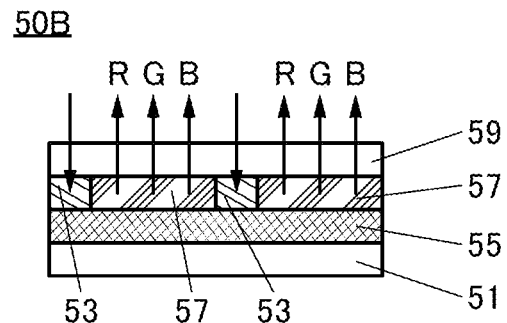

A display device 50A illustrated in FIG. 9A includes a layer 53 including a light-receiving element and a layer 57 including a light-emitting element between the first substrate 51 and the second substrate 59.

In the display device 50A and a display device 50B, red (R) light, green (G) light, and blue (B) light are emitted from the layer 57 including a light-emitting element.

The display device of one embodiment of the present invention includes a plurality of pixels arranged in a matrix. One pixel includes one or more subpixels. One subpixel includes one light-emitting element. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel further includes a light-receiving element. The light-receiving element may be provided in all the pixels or may be provided in some of the pixels. In addition, one pixel may include a plurality of light-receiving elements.

The element layer 55 including transistors preferably includes a first transistor and a second transistor. The first transistor is electrically connected to the light-receiving element. The second transistor is electrically connected to the light-emitting element.

Figure 9C:
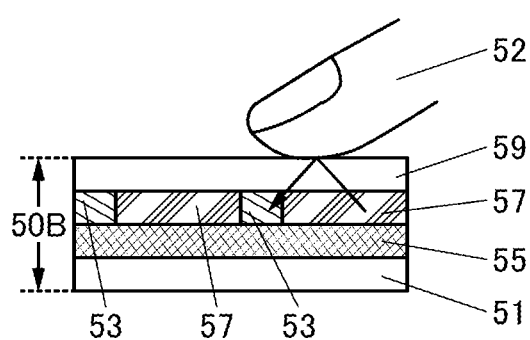

The display device of one embodiment of the present invention may have a function of detecting an object such as a finger that is touching the display device. For example, as illustrated in FIG. 9C, when light emitted from the light-emitting element in the layer 57 including a light-emitting element is reflected by the subject 52 such as a finger that touches the display device 50B, the light-receiving element in the layer 53 including a light-receiving element senses the reflected light. Thus, the touch of the subject 52 such as a finger on the display device 50B can be detected.

Figure 9D:
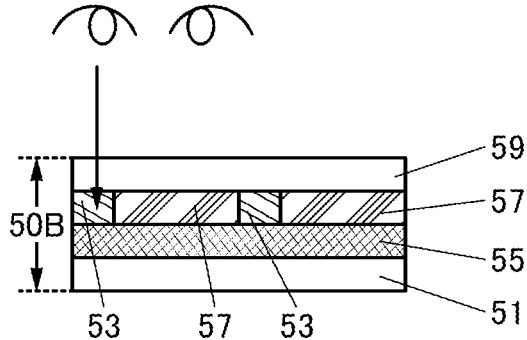

The display device of one embodiment of the present invention may have a function of detecting an object that is close to (but is not touching) the display device 50B as illustrated in FIG. 9D or capturing an image of such an object.

FIG. 9E, FIG. 9F, FIG. 9G, FIG. 9H, and FIG. 9I each illustrate an example of a pixel.

Figure 9E:
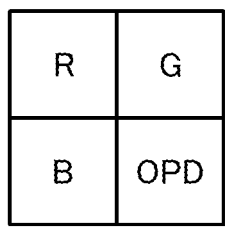
FIG. 9E, FIG. 9F, FIG. 9G, FIG. 9H, and FIG. 9I are top views illustrating examples of pixels.
Figure 9F:
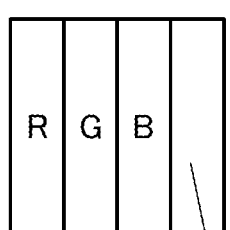

The pixel illustrated in each of FIG. 9E and FIG. 9F includes three subpixels (three light-emitting elements) of R, G, and B and the light-receiving element OPD. FIG. 9E illustrates an example in which the three subpixels and the light-receiving element OPD are arranged in a 2×2 matrix, and FIG. 9F illustrates an example in which the three subpixels and the light-receiving element OPD are arranged horizontally in one line.

Figure 9G:
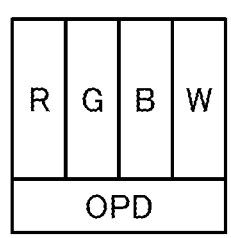

The pixel illustrated in FIG. 9G includes four subpixels (four light-emitting elements) of R, G, B, and W and the light-receiving element OPD.

Figure 9H:
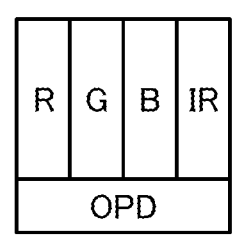

The pixel illustrated in FIG. 9H includes three subpixels of R, G, and B, a light-emitting element IR that emits infrared light, and the light-receiving element OPD. Here, the light-receiving element OPD preferably has a function of sensing infrared light. The light-receiving element OPD may have a function of sensing both visible light and infrared light. The wavelength of light sensed by the light-receiving element OPD can be determined depending on the application of the sensor.

Figure 9I:
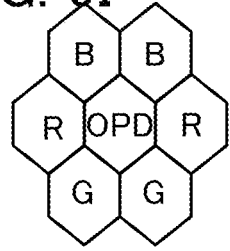

FIG. 9I illustrates one light-receiving element OPD and two pixels each including three subpixels of R, G, and B. In the case of utilizing Embodiment 1, the light-receiving element OPD is driven by time division. For example, in the case of driving by time division, one of the subpixels R emits light and then the other of the subpixels R emits light so that light emission timings are shifted, whereby an image is captured with the one light-receiving element OPD. In the case where an image is captured by time division driving, the subpixels B and the subpixels G do not necessarily emit light. FIG. 9E, FIG. 9F, FIG. 9G, and FIG. 9H each illustrate an arrangement example in which one OPD is provided for one pixel. When one OPD is provided for one pixel, the definition of OPD can be approximately twice the resolution of the pixels of the light-emitting elements. FIG. 9I illustrates an arrangement example in which one OPD is provided for two pixels, which can increase the light-emitting area in total. In addition, time division driving is employed even when one OPD is provided for two pixels, whereby the definition can be substantially the same as the case where two OPD are provided.

A more detailed structure of the display device of one embodiment of the present invention will be described below with reference to FIG. 10.

Figure 10:
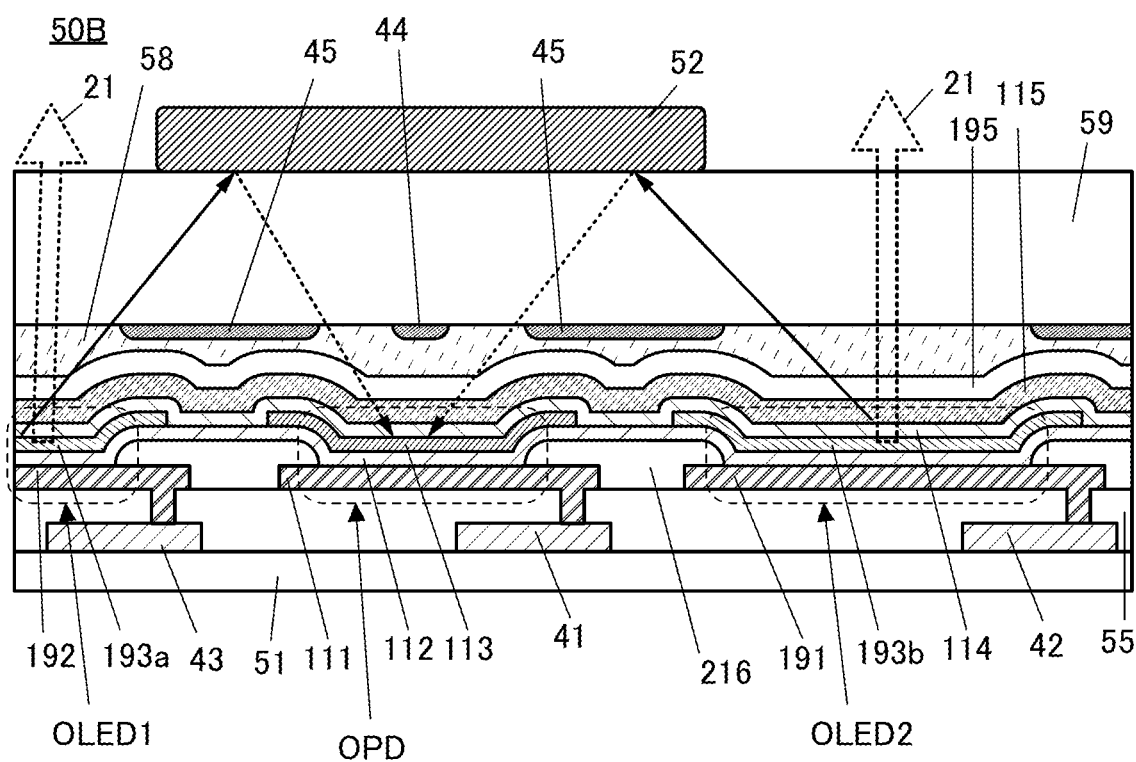
FIG. 10 is a cross-sectional view of an example of a display device.

FIG. 10 is a cross-sectional view of part of the display device 50B that captures an image of the subject 52 in contact with a display surface.

The display device 50B includes the light-receiving element OPD, the first light-emitting element OLED1, and the second light-emitting element OLED2.

The light-receiving element OPD includes a pixel electrode 111, a common layer 112, an active layer 113, a common layer 114, and a common electrode 115.

The first light-emitting element OLED1 includes a pixel electrode 192, the common layer 112, a light-emitting layer 193a, the common layer 114, and the common electrode 115.

The second light-emitting element OLED2 includes a pixel electrode 191, the common layer 112, a light-emitting layer 193b, the common layer 114, and the common electrode 115.

The pixel electrode 111, the pixel electrodes 191 and 192, the common layer 112, the active layer 113, the light-emitting layers 193a and 193b, the common layer 114, and the common electrode 115 may each have a single-layer structure or a stacked-layer structure.

The pixel electrode 111 and the pixel electrodes 191 and 192 are positioned over an insulating layer 214. The pixel electrode 111, the pixel electrode 191, and the pixel electrode 192 can be formed using the same material in the same step.

The common layer 112 is positioned over the pixel electrode 111, the pixel electrode 191, and the pixel electrode 192. The common layer 112 is a layer shared by the light-receiving element OPD, the light-emitting element OLED1, and the light-emitting element OLED2.

The active layer 113 overlaps with the pixel electrode 111 with the common layer 112 therebetween. The light-emitting layer 193b overlaps with the pixel electrode 191 with the common layer 112 therebetween. The active layer 113 includes a first organic compound, and the light-emitting layers 193a and 193b each include a second organic compound that is different from the first organic compound.

The common layer 114 is positioned over the common layer 112, the active layer 113, and the light-emitting layers 193a and 193b. The common layer 114 is a layer shared by the light-receiving element OPD, the light-emitting element OLED1, and the light-emitting element OLED2.

The common electrode 115 includes a portion overlapping with the pixel electrode 111 with the common layer 112, the active layer 113, and the common layer 114 therebetween. The common electrode 115 further includes a portion overlapping with the pixel electrode 191 with the common layer 112, the light-emitting layers 193a and 193b, and the common layer 114 therebetween. The common electrode 115 is a layer shared by the light-receiving element OPD, the light-emitting element OLED1, and the light-emitting element OLED2.

In the display device of this embodiment, an organic compound is used for the active layer 113 of the light-receiving element OPD. In the light-receiving element OPD, the layers other than the active layer 113 can have structures in common with the layers in the light-emitting element OLED1 (first EL element) and the light-emitting element OLED2 (second EL element). Therefore, the light-receiving element OPD can be formed concurrently with the formation of the light-emitting element OLED1 and the light-emitting element OLED2 only by adding a step of depositing the active layer 113 in the manufacturing process of the light-emitting element OLED1 and the light-emitting element OLED2. The light-emitting element OLED1, the light-emitting OLED2, and the light-receiving element OPD can be formed over one substrate. Accordingly, the light-receiving element OPD can be incorporated into the display device without a significant increase in the number of manufacturing steps.

The display device 50B is an example in which the light-receiving element OPD, the light-emitting element OLED1, and the light-emitting element OLED2 have a common structure except that the active layer 113 of the light-receiving element OPD, the light-emitting layer 193a of the light-emitting element OLED1, and the light-emitting layer 193b of the light-emitting element OLED2 are separately formed. Note that the structures of the light-receiving element OPD, the light-emitting element OLED1, and the light-emitting element OLED2 are not limited thereto. The light-receiving element OPD, the light-emitting element OLED1, and the light-emitting element OLED2 may include separately formed layers other than the active layer 113 and the light-emitting layers 193a and 193b. The light-receiving element OPD, the light-emitting element OLED1, and the light-emitting element OLED2 preferably include at least one layer used in common (common layer). Thus, the light-receiving element OPD can be incorporated into the display device without a significant increase in the number of manufacturing steps.

The display device 50B includes the light-receiving element OPD, the light-emitting element OLED1, the light-emitting element OLED2, a transistor 41, a transistor 42, a transistor 43, and the like between a pair of substrates (the first substrate 51 and the second substrate 59).

In the light-receiving element OPD, the common layer 112, the active layer 113, and the common layer 114, which are positioned between the pixel electrode 111 and the common electrode 115, can each also be referred to as an organic layer (a layer including an organic compound). The pixel electrode 111 preferably has a function of reflecting visible light. An end portion of the pixel electrode 111 is covered with a bank 216. The common electrode 115 has a function of transmitting visible light.

The light-receiving element OPD has a function of sensing light. Specifically, the light-receiving element OPD is a photoelectric conversion element that receives light incident from the outside of the display device 50B and converts it into an electric signal. The light received by the light-receiving element OPD can also be expressed as light that is emitted from the light-emitting element 190 and then reflected by an object.

The first light-blocking layer 45 and the second light-blocking layer 44 are provided on a surface of the second substrate 59 that faces the first substrate 51. The first light-blocking layer 45 has openings in a position overlapping with the light-receiving element OPD and in a position overlapping with the light-emitting element 190. Providing the first light-blocking layer 45 can control the range where the light-receiving element OPD senses light.

For the first light-blocking layer 45 and the second light-blocking layer 44, a material that blocks light emitted from the light-emitting element can be used. The first light-blocking layer 45 and the second light-blocking layer 44 preferably absorb visible light. As each of the first light-blocking layer 45 and the second light-blocking layer 44, a black matrix can be formed using a metal material or a resin material containing pigment (e.g., carbon black) or dye, for example. The first light-blocking layer 45 and the second light-blocking layer 44 may each have a stacked-layer structure of a red color filter, a green color filter, and a blue color filter.

Here, the light-receiving element OPD senses light that is emitted from the light-emitting element OLED1 and the light-emitting element OLED2 and then reflected by the subject 52 that is an object. However, in some cases, light emitted from the light-emitting element OLED1 and the light-emitting element OLED2 is reflected inside the display device 50B and enters the light-receiving element OPD without through an object. The first light-blocking layer 45 can reduce the influence of such stray light. For example, in the case where the first light-blocking layer 45 is not provided, light emitted from the light-emitting element OLED2 is reflected by the second substrate 59 and reflected light enters the light-receiving element OPD in some cases.

Providing the first light-blocking layer 45 can inhibit the reflected light from entering the light-receiving element OPD. Consequently, noise can be reduced, and the sensitivity of a sensor using the light-receiving element OPD can be increased.

The second light-blocking layer 44 is provided in a position overlapping with part of the light-receiving element OPD. By providing the second light-blocking layer 44, a sufficient S/N ratio can be obtained even when light emission timings of two light-emitting elements are shifted to capture an image by time division.

In the light-emitting element OLED1, the common layer 112, the light-emitting layer 193a, and the common layer 114, which are positioned between the pixel electrode 192 and the common electrode 115, can each also be referred to as an EL layer. In the light-emitting element OLED2, the common layer 112, the light-emitting layer 193b, and the common layer 114, which are positioned between the pixel electrode 191 and the common electrode 115, can each also be referred to as an EL layer.

Each of the pixel electrodes 191 and 192 preferably has a function of reflecting visible light. End portions of the pixel electrodes 191 and 192 are covered with the bank 216. The pixel electrode 111 and the pixel electrode 191 are electrically insulated from each other by the bank 216. The pixel electrode 111 and the pixel electrode 192 are electrically insulated from each other by the bank 216. The common electrode 115 has a function of transmitting visible light.

Each of the light-emitting element OLED1 and the light-emitting element OLED2 has a function of emitting visible light. Specifically, each of the light-emitting element OLED1 and the light-emitting element OLED2 is an electroluminescent element that emits light to the second substrate 59 side by applying voltage between the pixel electrode 191 and the common electrode 115 or between the pixel electrode 192 and the common electrode 115 (see light emission 21).

The pixel electrode 111 is electrically connected to a source or a drain of the transistor 41 through an opening provided in the insulating layer 214. The end portion of the pixel electrode 111 is covered with the bank 216.

The pixel electrode 191 is electrically connected to a source or a drain of the transistor 42 through an opening provided in the insulating layer 214. The end portion of the pixel electrode 191 is covered with the bank 216. The transistor 42 has a function of controlling the driving of the light-emitting element OLED2.

The pixel electrode 192 is electrically connected to a source or a drain of the transistor 43 through an opening provided in the insulating layer 214. The end portion of the pixel electrode 192 is covered with the bank 216. The transistor 43 has a function of controlling the driving of the light-emitting element OLED1.

The transistor 41, the transistor 42, and the transistor 43 are provided in the same layer (a layer over the first substrate 51 in FIG. 10).

At least part of a circuit electrically connected to the light-receiving element OPD and a circuit electrically connected to the light-emitting element 190 are preferably formed using the same material in the same step. In that case, the thickness of the display device can be reduced compared with the case where the two circuits are separately formed, resulting in simplification of the manufacturing steps.

The light-receiving element OPD, the light-emitting element OLED1, and the light-emitting element OLED2 are preferably covered with a protective layer 195. In FIG. 10, the protective layer 195 is provided on and in contact with the common electrode 115. Providing the protective layer 195 can inhibit entry of impurities such as water into the light-receiving element OPD, the light-emitting element OLED1, and the light-emitting element OLED2, so that the reliability of the light-receiving element OPD and the light-emitting element 190 can be increased. The protective layer 195 and the second substrate 59 are bonded to each other with the resin layer 58.

Figure 11A:
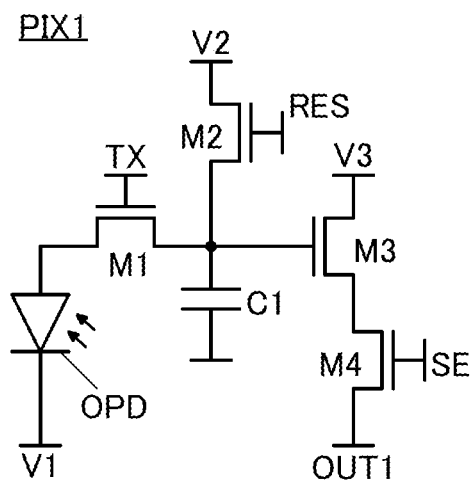
FIG. 11A and FIG. 11B are circuit diagrams each illustrating an example of a pixel circuit.
Figure 11B:
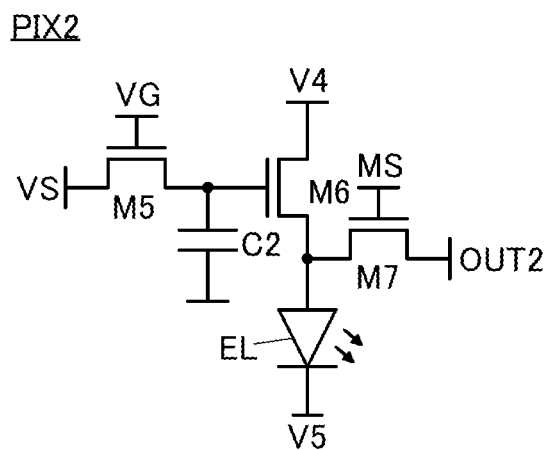

FIG. 11A illustrates an example of a first pixel circuit including a light-receiving element. FIG. 11B illustrates an example of a second pixel circuit including a light-emitting element.

A pixel circuit PIX1 illustrated in FIG. 11A includes the light-receiving element OPD, a transistor M1, a transistor M2, a transistor M3, a transistor M4, and a capacitor C1. Here, an example in which an organic photodiode is used as the light-receiving element OPD is illustrated.

A cathode of the light-receiving element OPD is electrically connected to a wiring V1, and an anode thereof is electrically connected to one of a source and a drain of the transistor M1. A gate of the transistor M1 is electrically connected to a wiring TX, and the other of the source and the drain thereof is electrically connected to one electrode of the capacitor C1, one of a source and a drain of the transistor M2, and a gate of the transistor M3. A gate of the transistor M2 is electrically connected to a wiring RES, and the other of the source and the drain thereof is electrically connected to a wiring V2. One of a source and a drain of the transistor M3 is electrically connected to a wiring V3, and the other of the source and the drain thereof is electrically connected to one of a source and a drain of the transistor M4. A gate of the transistor M4 is electrically connected to a wiring SE, and the other of the source and the drain thereof is electrically connected to a wiring OUT1.

A constant potential is supplied to the wiring V1, the wiring V2, and the wiring V3. When the light-receiving element OPD is driven with a reverse bias, a potential lower than the potential of the wiring V1 is supplied to the wiring V2. The transistor M2 is controlled by a signal supplied to the wiring RES and has a function of resetting the potential of a node connected to the gate of the transistor M3 to a potential supplied to the wiring V2. The transistor M1 is controlled by a signal supplied to the wiring TX and has a function of controlling the timing at which the potential of the node changes, in accordance with a current flowing through the light-receiving element OPD. The transistor M3 functions as an amplifier transistor for performing output in response to the potential of the node. The transistor M4 is controlled by a signal supplied to the wiring SE and functions as a selection transistor for reading an output corresponding to the potential of the node by an external circuit connected to the wiring OUT1.

A pixel circuit PIX2 illustrated in FIG. 11B includes a light-emitting element EL, a transistor M5, a transistor M6, a transistor M7, and a capacitor C2. Here, an example in which a light-emitting diode is used as the light-emitting element EL is illustrated. In particular, an organic EL element is preferably used as the light-emitting element EL.

A gate of the transistor M5 is electrically connected to a wiring VG, one of a source and a drain thereof is electrically connected to a wiring VS, and the other of the source and the drain thereof is electrically connected to one electrode of the capacitor C2 and a gate of the transistor M6. One of a source and a drain of the transistor M6 is electrically connected to a wiring V4, and the other thereof is electrically connected to an anode of the light-emitting element EL and one of a source and a drain of the transistor M7. A gate of the transistor M7 is electrically connected to a wiring MS, and the other of the source and the drain thereof is electrically connected to a wiring OUT2. A cathode of the light-emitting element EL is electrically connected to a wiring V5.

A constant potential is supplied to the wiring V4 and the wiring V5. In the light-emitting element EL, the anode side can have a high potential and the cathode side can have a lower potential than the anode side. The transistor M5 is controlled by a signal supplied to the wiring VG and functions as a selection transistor for controlling a selection state of the pixel circuit PIX2. The transistor M6 functions as a driving transistor that controls a current flowing through the light-emitting element EL, in accordance with a potential supplied to the gate. When the transistor M5 is in an on state, a potential supplied to the wiring VS is supplied to the gate of the transistor M6, and the emission luminance of the light-emitting element EL can be controlled in accordance with the potential. The transistor M7 is controlled by a signal supplied to the wiring MS and has a function of outputting a potential between the transistor M6 and the light-emitting element EL to the outside through the wiring OUT2.

Note that in the display device of this embodiment, the light-emitting element may be made to emit light in a pulsed manner so as to display an image. A reduction in the driving time of the light-emitting element can reduce the power consumption of the display device and suppress heat generation of the display device. An organic EL element is particularly preferable because of its favorable frequency characteristics. The frequency can be higher than or equal to 1 kHz and lower than or equal to 100 MHz, for example.

Here, a transistor using a metal oxide (an oxide semiconductor) in a semiconductor layer where a channel is formed is preferably used as the transistor M1, the transistor M2, the transistor M3, and the transistor M4 included in the pixel circuit PIX1 and the transistor M5, the transistor M6, and the transistor M7 included in the pixel circuit PIX2.

A transistor using a metal oxide having a wider band gap and a lower carrier density than silicon can achieve an extremely low off-state current. Thus, such a low off-state current enables retention of charge accumulated in a capacitor that is connected to the transistor in series for a long time. Therefore, it is particularly preferable to use a transistor using an oxide semiconductor as the transistor M1, the transistor M2, and the transistor M5 each of which is connected to the capacitor C1 or the capacitor C2 in series. Moreover, the use of transistors using an oxide semiconductor as the other transistors can reduce the manufacturing cost.

Alternatively, transistors using silicon as a semiconductor where a channel is formed can be used as the transistor M1 to the transistor M7. In particular, the use of silicon with high crystallinity, such as single crystal silicon or polycrystalline silicon, is preferable because high field-effect mobility is achieved and higher-speed operation is possible.

Alternatively, a transistor using an oxide semiconductor may be used as one or more of the transistor M1 to the transistor M7, and transistors using silicon may be used as the other transistors.

Although n-channel transistors are shown as the transistors in FIG. 11A and FIG. 11B, p-channel transistors can alternatively be used.

The transistors included in the pixel circuit PIX1 and the transistors included in the pixel circuit PIX2 are preferably formed side by side over the same substrate. It is particularly preferable that the transistors included in the pixel circuit PIX1 and the transistors included in the pixel circuit PIX2 be periodically arranged in one region.

One or more layers including one or both of the transistor and the capacitor are preferably provided to overlap with the light-receiving element OPD or the light-emitting element EL. Thus, the effective area of each pixel circuit can be reduced, and a high-resolution light-receiving portion or display portion can be achieved.

At least part of the configuration examples, the drawings corresponding thereto, and the like exemplified in this embodiment can be implemented in combination with the other configuration examples, the other drawings, and the like as appropriate.

At least part of this embodiment can be implemented in combination with the other embodiments described in this specification as appropriate.

Embodiment 3

In this embodiment, electronic devices of one embodiment of the present invention will be described with reference to FIG. 12 and FIG. 13.

An electronic device in this embodiment includes a display device of one embodiment of the present invention. For example, the display device of one embodiment of the present invention can be used in a display portion of the electronic device. The display device of one embodiment of the present invention has a function of sensing light, and thus can perform biometric authentication on the display portion or detect a touch or a near touch on the display portion. Thus, the electronic device can have improved functionality and convenience, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 12A:
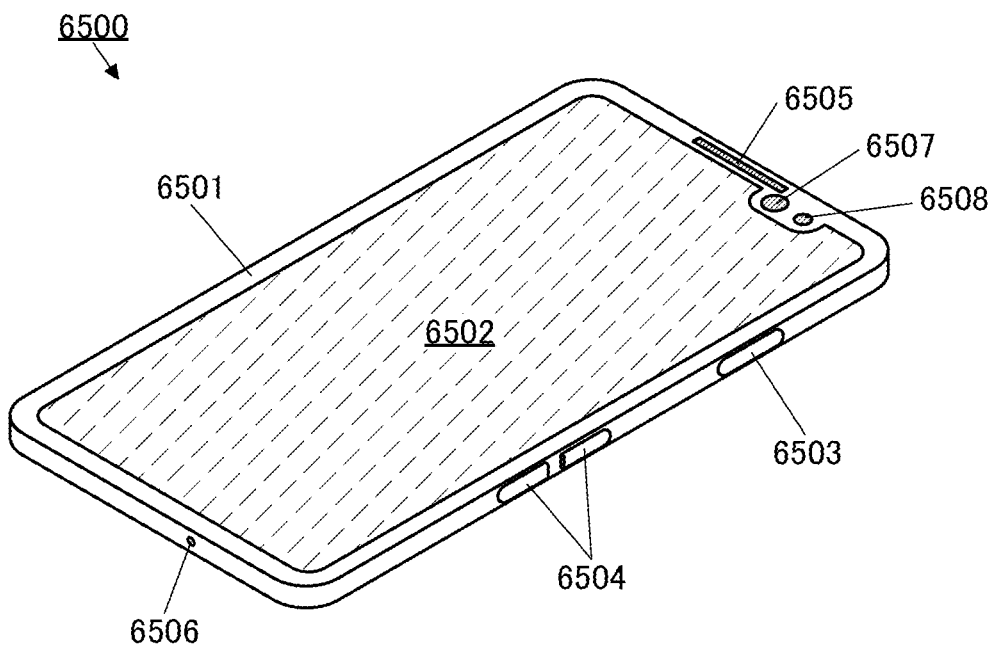
FIG. 12A is a perspective view illustrating an example of an electronic device.

An electronic device 6500 illustrated in FIG. 12A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 12B:
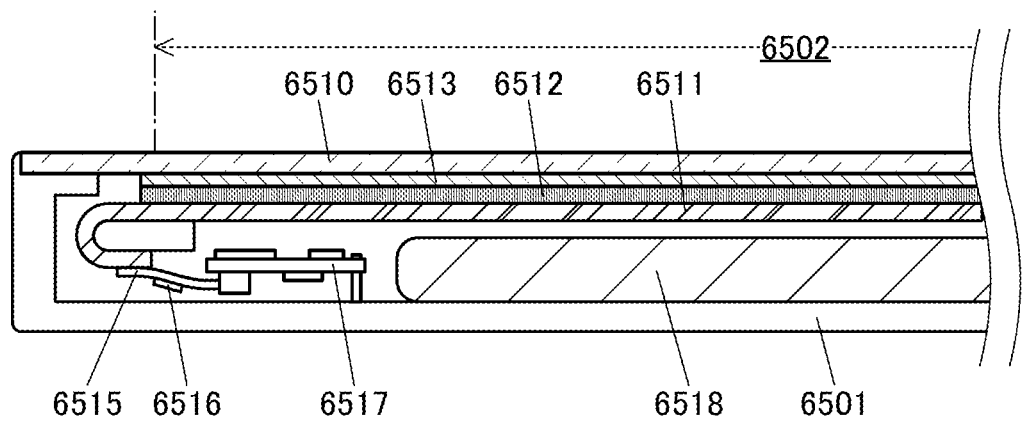
FIG. 12B is a cross-sectional view of the example of the electronic device.

FIG. 12B is a schematic cross-sectional view including an end portion of the housing 6501 on the microphone 6506 side.

A protection member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not shown).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A display of one embodiment of the present invention can be used as the display panel 6511. Thus, an extremely lightweight electronic device can be achieved. Since the display panel 6511 is extremely thin, the battery 6518 with high capacity can be mounted with the thickness of the electronic device controlled. An electronic device with a narrow frame can be achieved when part of the display panel 6511 is folded back so that the portion connected to the FPC 6515 is provided on the rear side of a pixel portion.

Figure 13A:
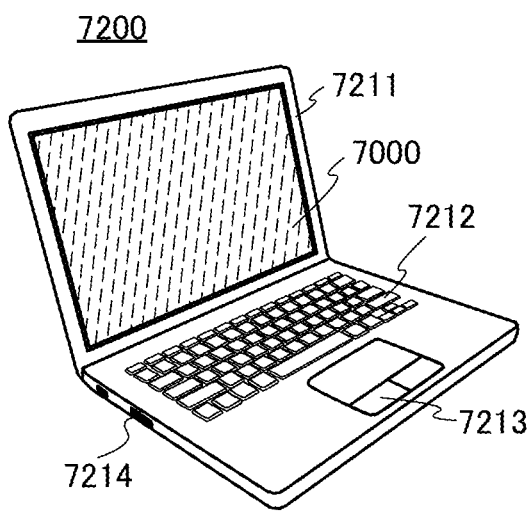
FIG. 13A and FIG. 13B are diagrams each illustrating an example of an electronic device.

FIG. 13A illustrates an example of a laptop personal computer. A laptop personal computer 7200 includes a housing 7211, a keyboard 7212, a pointing device 7213, an external connection port 7214, and the like. The display portion 7000 is incorporated into the housing 7211.

A display device of one embodiment of the present invention can be used in the display portion 7000.

Figure 13B:
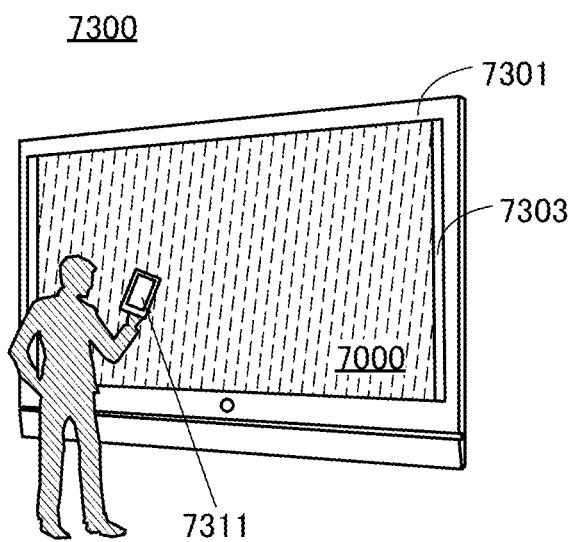

FIG. 13B illustrates an example of digital signage.

Digital signage 7300 illustrated in FIG. 13B includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

The display device of one embodiment of the present invention can be used in the display portion 7000 in FIG. 13B.

A larger area of the display portion 7000 can increase the amount of data that can be provided at a time. The larger display portion 7000 attracts more attention, so that the advertising effectiveness can be enhanced, for example.

The use of a touch panel in the display portion 7000 is preferable because in addition to display of an image or a moving image on the display portion 7000, intuitive operation by a user is possible. Moreover, for an application for providing information such as route information or traffic information, usability can be enhanced by intuitive operation.

As illustrated in FIG. 13B, the digital signage 7300 is preferably capable of working with an information terminal 7311 such as a user's smartphone through wireless communication. For example, information of an advertisement displayed on the display portion 7000 can be displayed on a screen of the information terminal 7311. By operation of the information terminal 7311, display on the display portion 7000 can be switched.

It is possible to make the digital signage 7300 execute a game with use of the screen of the information terminal 7311 as an operation means (controller). Thus, an unspecified number of users can join in and enjoy the game concurrently.

At least part of the configuration examples, the drawings corresponding thereto, and the like exemplified in this embodiment can be implemented in combination with the other configuration examples, the other drawings, and the like as appropriate.

At least part of this embodiment can be implemented in combination with the other embodiments described in this specification as appropriate.

REFERENCE NUMERALS

21: light emission, 41: transistor, 42: transistor, 43: transistor, 44: second light-blocking layer, 45: first light-blocking layer, 50A: display device, 50B: display device, 51: first substrate, 52: subject, 53: layer, 55: element layer, 57: layer, 58: resin layer, 59: second substrate, 111: pixel electrode, 112: common layer, 113: active layer, 114: common layer, 115: common electrode, 190: light-emitting element, 191: pixel electrode, 192: pixel electrode, 193a: light-emitting layer, 193b: light-emitting layer, 195: protective layer, 214: insulating layer, 216: bank, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7200: laptop personal computer, 7211: housing, 7212: keyboard, 7213: pointing device, 7214: external connection port, 7300: digital signage, 7301: housing, 7303: speaker, 7311: information terminal.

This application is based on Japanese Patent Application Serial No. 2019-131601 filed on Jul. 17, 2019, the entire contents of which are hereby incorporated herein by reference.

The invention claimed is:

1. A display device comprising:
    a first light-emitting region, a second light-emitting region, and a light-receiving region between the first light-emitting region and the second light-emitting region each being over a first substrate;
    an insulating layer over the first light-emitting region, the second light-emitting region, and the light-receiving region; and
    a first light-blocking layer and a second light-blocking layer over second substrate the insulating layer,
    wherein a first opening portion of the first light-blocking layer and the first light-emitting region overlap each other,
    wherein a second opening portion of the first light-blocking layer and the second light-emitting region overlap each other,
    wherein a third opening portion of the first light-blocking layer and the light-receiving region overlap each other,
    wherein the second light-blocking layer is in the third opening portion of the first light-blocking layer, and
    wherein the second light-blocking layer and a first part of the light-receiving region overlap each other.

2. The display device according to claim 1, wherein the first light-emitting region is a green-light-emitting region.

3. The display device according to claim 1, wherein a width of the second light-blocking layer is greater than or equal to 5 μm and less than or equal to 10 μm.

4. The display device according to claim 1, wherein the first light-blocking layer and the second light-blocking layer comprise a same material.

5. The display device according to claim 1, further comprising:
   a second substrate over the first light-blocking layer and the second light-blocking layer; and
   a light-transmitting organic resin between the first substrate and the second substrate.

6. The display device according to claim 1, wherein each of the first light-emitting region and the second light-emitting region comprises a pixel electrode and an organic compound layer overlapping with the pixel electrode.

7. The display device according to claim 6, wherein the light-receiving region comprises a same material as the organic compound layer.

8. The display device according to claim 1, wherein the second light-blocking layer and a second part of the light-receiving region do not overlap each other.

* * * * *